United States Patent
Mohapatra et al.

(10) Patent No.: US 10,559,683 B2
(45) Date of Patent: Feb. 11, 2020

(54) APPARATUS AND METHODS TO CREATE A BUFFER TO REDUCE LEAKAGE IN MICROELECTRONIC TRANSISTORS

(71) Applicant: Intel Corporation, Santa Clara, CA (US)

(72) Inventors: Chandra S. Mohapatra, Hillsboro, OR (US); Anand S. Murthy, Portland, OR (US); Glenn A. Glass, Portland, OR (US); Tahir Ghani, Portland, OR (US); Willy Rachmady, Beaverton, OR (US); Gilbert Dewey, Hillsboro, OR (US); Matthew V. Metz, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/504,171

(22) PCT Filed: Sep. 19, 2014

(86) PCT No.: PCT/US2014/056528
§ 371 (c)(1),
(2) Date: Feb. 15, 2017

(87) PCT Pub. No.: WO2016/043770
PCT Pub. Date: Mar. 24, 2016

(65) Prior Publication Data
US 2017/0278964 A1    Sep. 28, 2017

(51) Int. Cl.
*H01L 29/78* (2006.01)
*H01L 29/786* (2006.01)
(Continued)

(52) U.S. Cl.
CPC .... *H01L 29/7827* (2013.01); *H01L 21/76224* (2013.01); *H01L 29/0649* (2013.01);
(Continued)

(58) Field of Classification Search
None
See application file for complete search history.

(56) References Cited

U.S. PATENT DOCUMENTS

| 5,633,516 A | 5/1997 | Mishima |
| 8,114,746 B2 | 2/2012 | Wei et al. |

(Continued)

FOREIGN PATENT DOCUMENTS

| JP | 06069248 | 3/1994 |
| JP | 2002151688 | 5/2002 |

(Continued)

OTHER PUBLICATIONS

International Preliminary Report on Patentability and Written Opinion Received for PCT Patent Application No. PCT/US2014/056528, dated Mar. 30, 2017, 11 pages.

(Continued)

*Primary Examiner* — Bo B Jang
(74) *Attorney, Agent, or Firm* — Green, Howard & Mughal LLP

(57) ABSTRACT

Transistor devices having a buffer between an active channel and a substrate, which may include the active channel comprising a low band-gap material on a sub-structure, e.g. a buffer, between the active channel and the substrate. The sub-structure may comprise a high band-gap material having a desired conduction band offset, such that leakage may be arrested without significant impact on electronic mobility within the active channel. In an embodiment, the active channel and the sub-structure may be formed in a narrow trench, such that defects due to lattice mismatch between the (Continued)

active channel and the sub-structure are terminated in the sub-structure. In a further embodiment, the sub-structure may be removed to form either a void between the active channel and the substrate, or an insulative material may be disposed between the active channel and the substrate, such that the void or the insulative material form an insulative buffer.

13 Claims, 9 Drawing Sheets

(51) Int. Cl.
| | |
|---|---|
| *H01L 29/10* | (2006.01) |
| *H01L 21/762* | (2006.01) |
| *H01L 29/06* | (2006.01) |
| *H01L 29/66* | (2006.01) |
| *H01L 29/201* | (2006.01) |
| *H01L 29/423* | (2006.01) |

(52) U.S. Cl.
CPC ........ *H01L 29/1054* (2013.01); *H01L 29/201* (2013.01); *H01L 29/4238* (2013.01); *H01L 29/66666* (2013.01); *H01L 29/785* (2013.01); *H01L 29/78696* (2013.01); *H01L 29/66545* (2013.01)

(56) References Cited

U.S. PATENT DOCUMENTS

| 8,691,640 | B1 | 4/2014 | Licausi |
| 9,214,555 | B2 | 12/2015 | Oxland et al. |
| 9,252,275 | B2 | 2/2016 | Rachmady et al. |
| 2002/0014860 | A1 | 2/2002 | Rachwal |
| 2006/0084247 | A1* | 4/2006 | Liu .................. H01L 21/28097 438/510 |
| 2007/0029640 | A1 | 2/2007 | Isono |
| 2009/0321717 | A1 | 12/2009 | Pillarisetty et al. |
| 2010/0301390 | A1 | 12/2010 | Ko |
| 2011/0147711 | A1 | 6/2011 | Pillarisetty |
| 2012/0168913 | A1 | 7/2012 | Toh et al. |
| 2013/0034943 | A1 | 2/2013 | Lochtefeld |
| 2013/0105860 | A1 | 5/2013 | Lochtefeld et al. |
| 2013/0126972 | A1 | 5/2013 | Wang |
| 2013/0126981 | A1 | 5/2013 | Ho et al. |
| 2013/0154016 | A1 | 6/2013 | Glass |
| 2013/0234147 | A1 | 9/2013 | Wu et al. |
| 2013/0270607 | A1 | 10/2013 | Doornbos et al. |
| 2014/0001572 | A1 | 1/2014 | Bohr et al. |
| 2014/0151814 | A1 | 6/2014 | Giles et al. |
| 2014/0166981 | A1 | 6/2014 | Doyle et al. |
| 2014/0213031 | A1 | 7/2014 | Lin |
| 2014/0227846 | A1 | 8/2014 | Liaw |
| 2014/0264438 | A1 | 9/2014 | Holland et al. |
| 2015/0001588 | A1 | 1/2015 | Gunji et al. |
| 2016/0204037 | A1* | 7/2016 | Goel .................. H01L 29/267 438/429 |

FOREIGN PATENT DOCUMENTS

| JP | 2006270107 | 10/2006 |
| JP | 2008527723 | 7/2008 |
| JP | 2008546181 | 12/2008 |
| JP | 2009170511 | 7/2009 |
| JP | 2010278435 | 12/2010 |
| JP | 2011527103 | 10/2011 |
| JP | 2013513250 | 4/2013 |
| TW | 201347046 | 11/2013 |
| TW | 201436213 | 9/2014 |
| WO | 2006125040 | 11/2006 |
| WO | 2014/133293 A1 | 9/2014 |
| WO | 2013121926 | 5/2015 |

OTHER PUBLICATIONS

International Search Report and Written Opinion received for PCT Patent Application No. PCT/US2014/056528, dated Jun. 19, 2015, 14 pages.
Extended European Search report for European Patent Application No. 14901896.2, dated Apr. 17, 2018.
Partial European Search Report from European Patent Application No. 14901856.6 dated Apr. 6, 2018, 12 pgs.
International Search Report and Written Opinion received for PCT Patent Application No. PCT/US2014/056564 dated Jun. 19, 2015.
International Search Report and Written Opinion received for PCT Patent Application No. PCT/US2014/056526 dated Jun. 19, 2015.
Non-Final Office Action for U.S. Appl. No. 15/503,989, dated Nov. 8, 2017.
Restriction Requirement for U.S. Appl. No. 15/504,280, dated Jan. 18, 2018.
Restriction Requirement from U.S. Appl. No. 15/504,280 dated Aug. 11, 2017, 6 pgs.
Restrictions Requirement for U.S. Appl. No. 15/503,989, dated Aug. 16, 2017.
Advisory Action for U.S. Appl. No. 15/503,989, dated Jul. 16, 2018.
Extended European Search Report from European Patent Application No. 14901856.6 dated Jul. 16, 2018, 11 pgs.
Final Office Action for U.S. Appl. No. 15/503,989, dated May 7, 2018.
Non-Final Office Action for U.S. Appl. No. 15/504,280, dated Jun. 12, 2018.
Non-Final Office Action from Japanese Patent Application No. 2017-507850 dated Jun. 26, 2018, 9 pgs.
Notice of Reasons for Rejection for Japan Patent Application No. 2017504754, dated Jun. 18, 2018.
Non-Final Office Action from Taiwan Patent Application No. 104126396 dated Nov. 26, 2018, 9 pgs.
Non-Final Office Action from Japanese Patent Application No. 2017-507850 dated Feb. 19, 2019, 11 pgs.
Non-Final Office Action from Taiwan Patent Application No. 104126396 dated May 31, 2019, 6 pgs.
Notice of Allowance from Japanese Patent Application No. 2017-507850 dated Jun. 11, 2019, 4 pgs.

* cited by examiner

APPARATUS AND METHODS TO CREATE A BUFFER TO REDUCE LEAKAGE IN MICROELECTRONIC TRANSISTORS

RELATED APPLICATION

The present application is a national stage entry of PCT Patent Application No. PCT/US2014/056528, filed on Sep. 19, 2014, entitled "APPARATUS AND METHODS TO CREATE A BUFFER TO REDUCE LEAKAGE IN MICROELECTRONIC TRANSISTORS", which is hereby incorporated herein by reference in its entirety and for all purposes.

TECHNICAL FIELD

Embodiments of the present description generally relate to the field of microelectronic devices, and, more particularly, to forming a buffer adjacent to an active channel in a microelectronic transistor to reduce current leakage.

BACKGROUND

Higher performance, lower cost, increased miniaturization of integrated circuit components, and greater packaging density of integrated circuits are ongoing goals of the microelectronic industry for the fabrication of microelectronic devices. To achieve these goals, transistors within the microelectronic devices must scale down, i.e. become smaller. Along with the reduction in the size of transistors, there has also been a drive to improve their efficiency with improvement in their designs, materials used, and/or in their fabrication processes. Such design improvements include the development of unique structures, such as non-planar transistors, including tri-gate transistors, FinFETs, TFETS, omega-FETs, and double-gate transistors.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
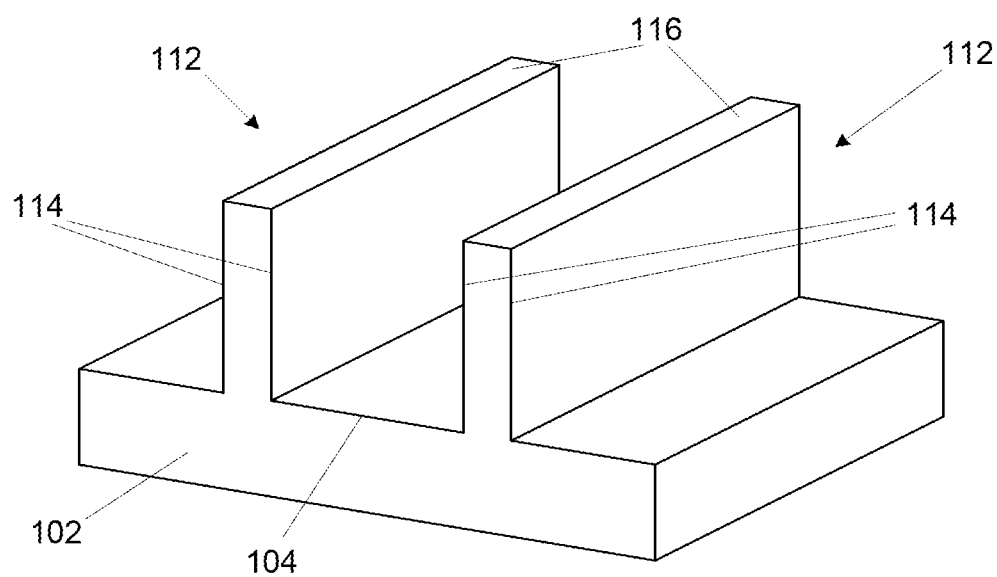
FIGS. 1-8 are oblique sectional views of the fabrication of forming a high band-gap buffer for a non-planar transistor, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

As will be understood to those skilled in the art, controlling the source to drain leakage through the sub-substructures below active channels is an important consideration in any transistor design. In non-planar transistor devices, such III-V NMOS TFET devices, sub-structure leakage presents more of a challenge. This challenge stems from the high mobility materials which are required for the formation of active channel in order to achieve high electron mobility, which inherently have low band gap and, hence, high conductivity. Non-planar transistors may utilize low band-gap materials, such as indium gallium arsenide, in the formation of active channels, which has a band-gap lower than a typical silicon substrate over which active channels are formed. If the sub-structure is composed of these high conductivity materials, then leakage would be considerable, as the sub-structure material would form a conductive path between the source and drain.

Embodiments of the present description relate to the fabrication of transistor devices having a buffer between an active channel and a substrate. In at least one embodiment of the present description, an active channel comprising a low band-gap III-V material may be epitaxially grown on a sub-structure, e.g. a buffer, between the active channel and the substrate. The sub-structure may comprise a high band-gap III-V material, which may have a desired conduction band offset, such that leakage may be arrested without having a significant impact on electronic mobility within the active channel. With the embodiments of the present description, leakage may be decreased by at least three orders of magnitude compared with forming an active channel without such a buffer. In an embodiment of the present description, the active channel and the sub-structure may be formed in a narrow trench, such that defects due to lattice mismatch between the active channel and the sub-structure are terminated by defect trapping in the sub-structure below the active channel region. In a further embodiment, the sub-structure may be removed to form either a void between the active channel and the substrate, or an insulative material may be disposed between the active channel and the substrate, such that the void or the insulative material form an insulative buffer.

As shown in FIG. 1, at least one fin 112 may be formed on a substrate 102, wherein the fins 112 may include opposing sidewalls 114 extending from a first surface 104 of the substrate 102 and which terminate in an upper surface 116. For the clarity and brevity, only two fins 112 are illustrated in FIG. 1; however, it is understood that any appropriate number of fins 112 could be fabricated. In one embodiment, an etch mask (not shown) may be patterned on the substrate 102 followed by the etching of the substrate 102, wherein the portions of the substrate 102 protected by etch mask (not shown) become the fins 112, and the etch mask (not shown) may be thereafter removed, as will be understood to those skilled in the art. In an embodiment of the present disclosure, the substrate 102 and the fins 112 may be any appropriate material, including, but not limited to, a silicon-containing material, such as monocrystalline silicon. The substrate 102 and the fins 112, however, need not necessarily be fabricated from silicon-containing materials, and can be other types of materials known in the art. In a further embodiment, the substrate 102 may comprise a silicon-on-insulator (SOI) substrate, a silicon-on-nothing (SON), a germanium substrate, a germanium-on-insulator (GeOI) substrate, or a germanium-on-nothing (GeON).

Figure 2:
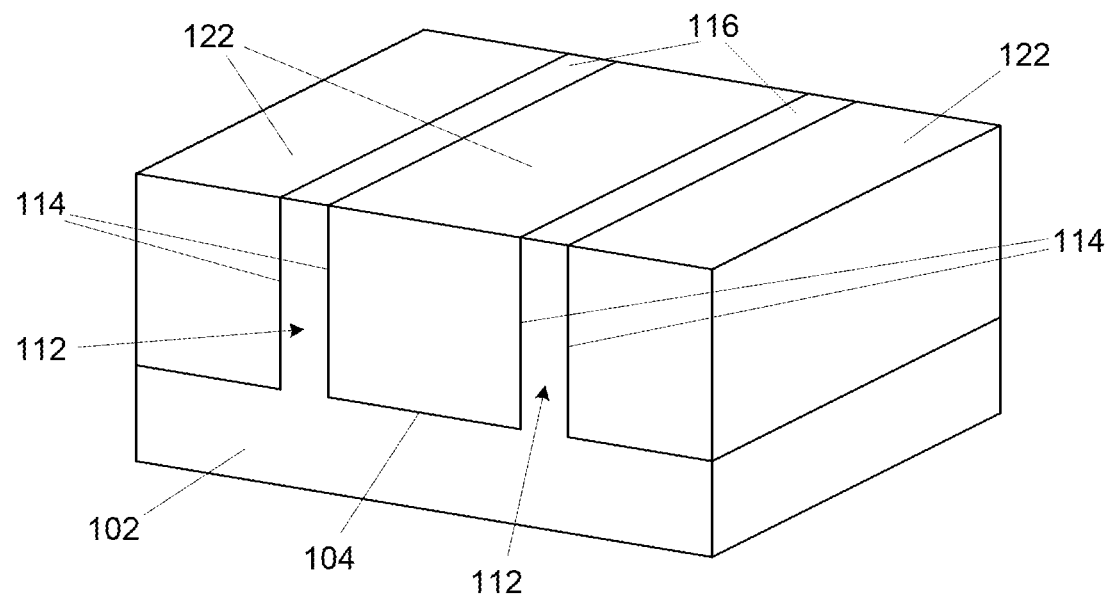

As shown in FIG. 2, a dielectric material may be deposited, by any appropriate deposition process, over the substrate 102 and the fins 112, and the dielectric material may be planarized to exposed the fin upper surface 116, thereby forming isolation structures 122, known as shallow trench isolation structures, abutting the opposing fin sidewalls 114. The isolation structures 122 may be formed from any appropriate dielectric material, including but not limited to, silicon oxide ($SiO_2$).

Figure 3:
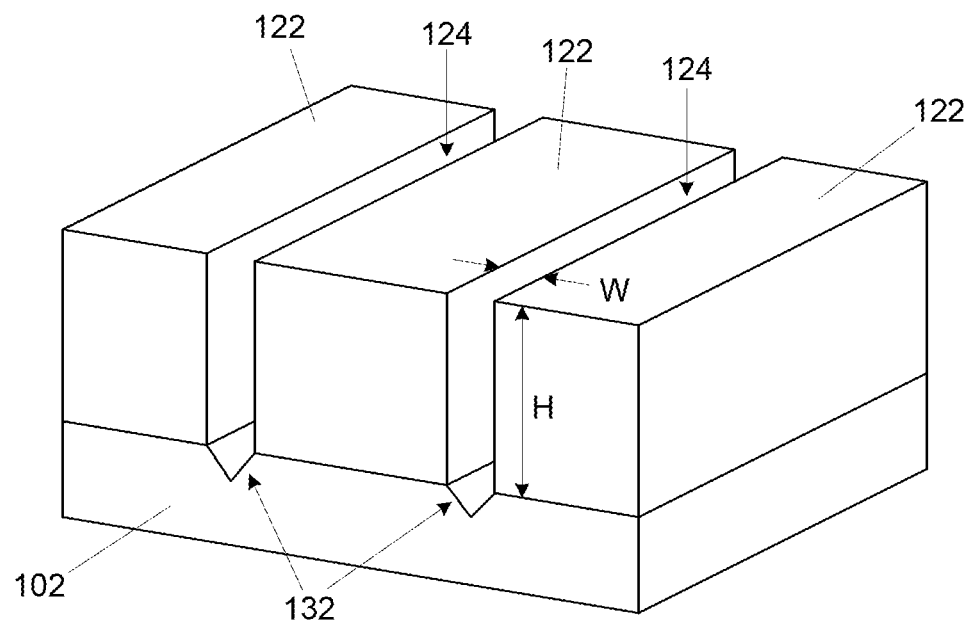

As shown in FIG. 3, the fins 112 may be removed, thereby forming a trench 124. The fins 112 may be removed by any known etching techniques, including, but not limited to, dry etching, wet etching, or combinations thereof. In one embodiment, a portion of the each trench 124 may be formed to extend into the substrate 102 either during the removal of the fins 112 or thereafter. This portion of the trench 124 will hereinafter be referred to as a nucleation trench 132. In one embodiment, the nucleation trench 132 may have a (111) faceting, which may facilitate the growth of a III-V material, as will be discussed. It is understood that alternate geometries of the nucleation trench 132 may be utilized.

Figure 4:
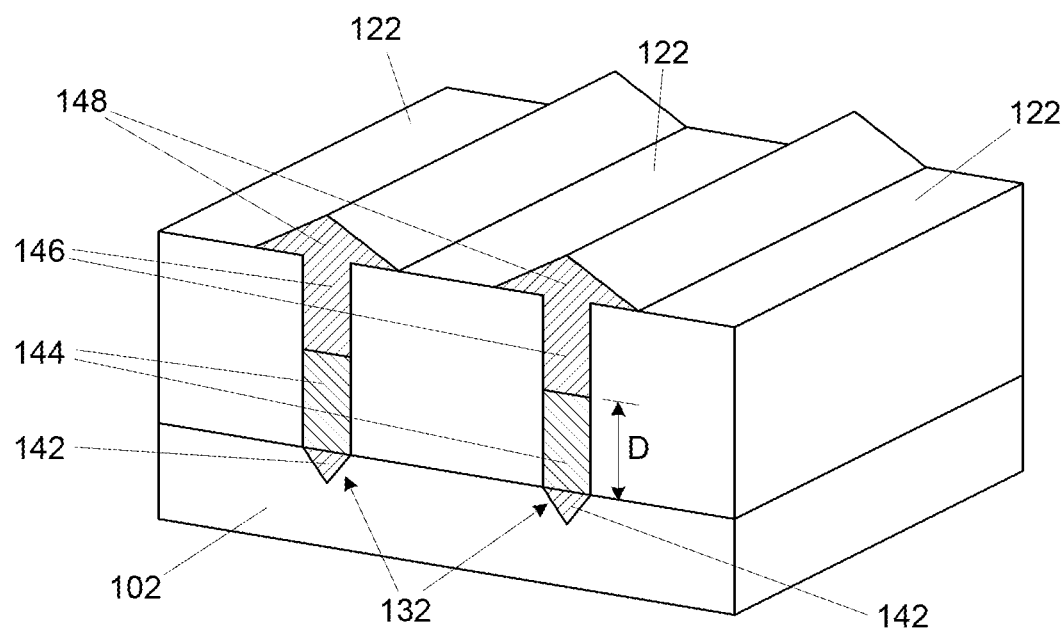

As shown in FIG. 4, a nucleation layer 142 may be formed in the nucleation trench 132. The nucleation layer 142 may be formed by any formation process and may be any appropriate material, such as a III-V epitaxial material, including but not limited to, indium phosphide, gallium phosphide, gallium arsenide, and like.

As further shown in FIG. 4, a sub-structure 144 may be formed on the nucleation layer 142 within the trench 124 (see FIG. 3). The sub-structure 144 may be formed by any known formation process, and may be any appropriate material, such as a high band-gap III-V material, including, but not limited to, indium aluminum arsenide, indium phosphide, gallium phosphide, gallium arsenide, gallium arsenide antimonide, aluminium arsenide antimonide, indium aluminum gallium arsenide, indium aluminum gallium phosphide, aluminum gallium arsenide, and the like. For the purpose of the present description, a high band-gap material may be defined to be a material that has a band-gap greater than silicon. In one embodiment, the sub-structure 144 may be the same material as the nucleation layer 142. In other embodiments, the nucleation layer 142 may be graded into the sub-structure 144 or the material compositions thereof may be stepped in concentration from one to the other, as will be understood to those skilled in the art.

As yet further shown in FIG. 4, an active channel 146 may be formed on the sub-structure 144 within the trench 124 (see FIG. 3). The active channel 146 may be formed by any known formation process, and may be any appropriate material, such as a low band-gap III-V epitaxial material, including, but not limited to indium gallium arsenide, indium arsenide, indium antimonide, and the like. For the purpose of the present description, a low band-gap material may be defined to be a material that has a band-gap less than silicon. In one embodiment, the active channel 146 may be undoped (electrically neutral or doped with less than 5E17 carriers of either p-type or n-type dopants).

In some example embodiments, the nucleation layer 142, the sub-structure 144 and/or the active channel 146 may be epitaxially deposited. The thickness $T_s$ (see FIG. 5) of the sub-structure 144 (see FIG. 5) and the thickness $T_a$ of the active channel 146 may be in the range, for example, of about 500 to 5000 Å, in accordance with some specific example embodiments, although other embodiments may have other layer thicknesses, as will be apparent in light of this disclosure. In particular trench-fill embodiments will be in this thickness range while blanket deposition and subsequent patterning embodiments can have thickness values up to 100 times higher. In some embodiments, a chemical vapor deposition (CVD) process or other suitable deposition technique may be used for the depositing or otherwise forming the nucleation layer 142, the sub-structure 144 and/or the active channel. For example, the deposition may be carried out by CVD, or rapid thermal CVD (RT-CVD), or low pressure CVD (LP-CVD), or ultra-high vacuum CVD (UHV-CVD), or gas source molecular beam epitaxy (GS-MBE) tools using III-V material compounds, such as combinations of indium, aluminum, arsenic, phosphorus, gallium, antimony, and/or precursors thereof In one specific such example embodiment, the active channel 146 may be indium gallium arsenide, and the nucleation layer 142 and the sub-structure 144 may be indium phosphide. In any such embodiments, there may be a precursor bubbler with a carrier gas such as, for instance, hydrogen, nitrogen, or a noble gas (e.g., precursor may be diluted at about 0.1-20% concentration with the balance being carrier gas). In some example cases, there may be an arsenic precursor such as arsine or tertiary butyl arsine, a phosphorous precursor such as tertiary butylphosphine, a gallium precursor such as trimethylgallium, and/or an indium precursor such as trimethylindium. There may also be an etchant gas such as, for example, halogen-based gas such as hydrogen chloride (HCl), chlorine (Cl), or, hydrogen bromide (HBr). The basic deposition of the nucleation layer 142, the sub-structure 144, and/or the active channel 146 may be possible over a wide range of conditions using a deposition temperature in the range, for example, from between about 300° C. and 650° C., or in a more specific example, from between about 400 and 500° C.) and reactor pressure, for instance, in the range of between about 1 Torr and 760 Torr. Each of the carrier and etchants can have a flow in the range of between about 10 and 300 SCCM (typically, no more than 100 SCCM of flow is required, but some embodiments may benefit from higher flow rates). In one specific example embodiment, the deposition of the nucleation layer 142, the sub-structure 144, and/or the active channel 146 may be carried out at a flow rate that ranges between about 100 and 1000 SCCM.

The material utilized for the sub-structure 144 may be selected to have the desired conduction band offset with the active channel 146 which will be effective in excluding electrons from the sub-structure 144, thereby reducing leakage. Furthermore, as the formation of the nucleation layer 142, the sub-structure 144, and the active channel 146 occurs in a relatively narrow trench 124. In one embodiment, the narrow trench 124 may have a height H (see FIG. 3) in the range of about 50 to 500 nm and a width W (see FIG. 3) of less than about 25 nm (preferably less than 10 nm). Lattice mismatch between the substrate 102 and the nucleation layer 142/sub-structure 144 can be larger than that which allows for substantially defect free formation, as the nucleation layer 142/sub-structure 144 may be formed to have a sufficient depth D to trap defects, such as stacking faults, dislocations, and the like, away from the active channel 146, as will be understood to those skilled in the art. Thus, electron mobility in the active channel 146 may not be significantly impaired thereby. While the active channel 146 may not achieve theoretical maximum mobility values, it nevertheless provides a compelling performance advantage relative to silicon based n-MOS transistors. In one embodiment the sub-structure 144 may have a depth D (e.g. the distance between the substrate 102 and the active channel 146) of greater than about 50 nm and a width of less than about 25 nm (i.e. the trench width W).

Figure 5:
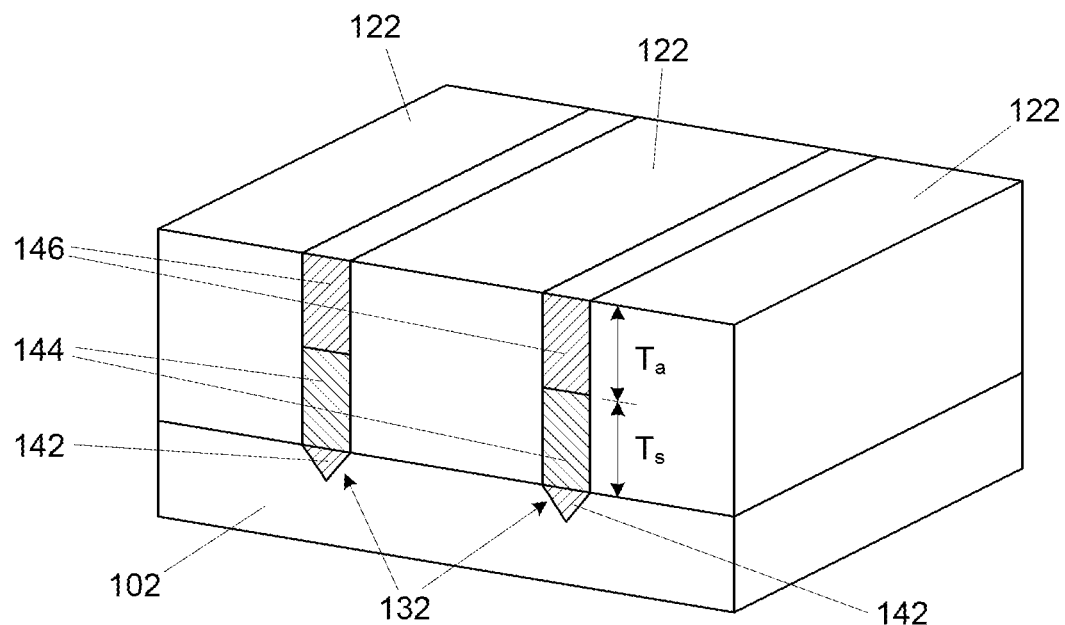
Figure 6:
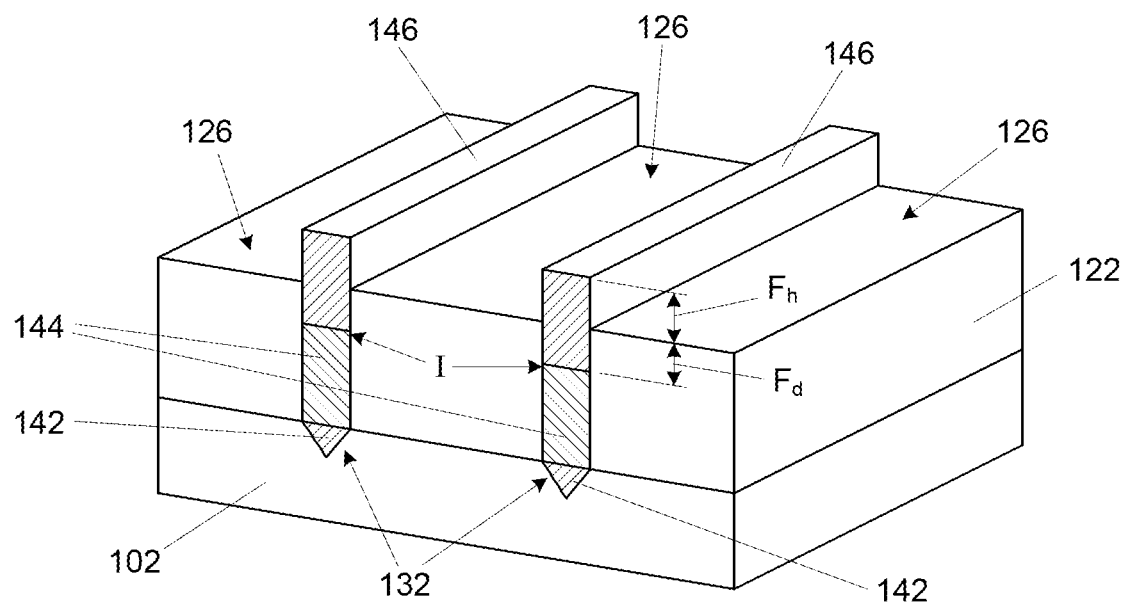

As still further shown in FIG. 4, a portion 148 of active channel 146 may extend out of the trench (see FIG. 3), particularly when epitaxial growth processes are utilized. Thus, as shown in FIG. 5, the portion 148 of the active channel 146 may be removed, such as by chemical mechanical planarization. As shown in FIG. 6, the isolation structures 122 may be recessed, such as by an etching process, such that at least a portion of the active channel 146 extends above an upper plane 126 of the isolation structures 122. In one embodiment, the height $F_h$ of the active channel 146 extending about the isolation structure upper plane 126 may be about 45 nm. An intersection I between the active channel 146 and the sub-structure 144 may occur at a depth $F_d$ relative to the isolation structure upper plane 126. In an embodiment, the intersection I may be slightly above or slightly below the isolation structure upper plane 126, such as about 10 nm above or below.

Figure 7:
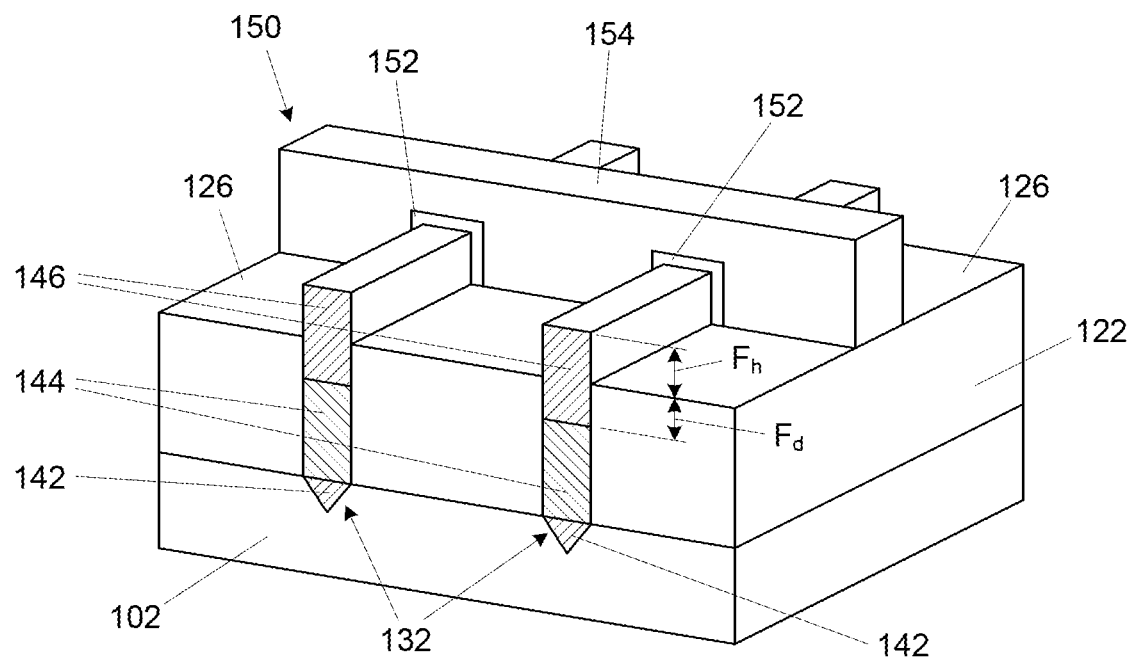

As shown in FIG. 7, at least one gate 150 may be form over the portion of the active channel 146 extending above the isolation structures 122. The gate 150 may be fabricated by forming a gate dielectric layer 152 on or adjacent to the fin upper surface 116 and on or adjacent to the pair of laterally opposing fin sidewalls 114, and forming a gate electrode 154 on or adjacent the gate dielectric layer 152, either by a gate first or a gate last process flow, as will be understood to those skilled in the art.

The gate dielectric layer 152 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 152 can be formed by well-known techniques, such as by depositing a gate electrode material, such as chemical vapor deposition ("CVD"), physical vapor deposition ("PVD"), atomic layer deposition ("ALD"), and then patterning the gate electrode material with well-known photolithography and etching techniques, as will be understood to those skilled in the art.

The gate electrode 154 can be formed of any suitable gate electrode material. In an embodiment of the present disclosure, the gate electrode 154 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 154 can be formed by well-known techniques, such as by blanket depositing a gate electrode material and then patterning the gate electrode material with well-known photolithography and etching techniques, as will be understood to those skilled in the art.

Figure 8:
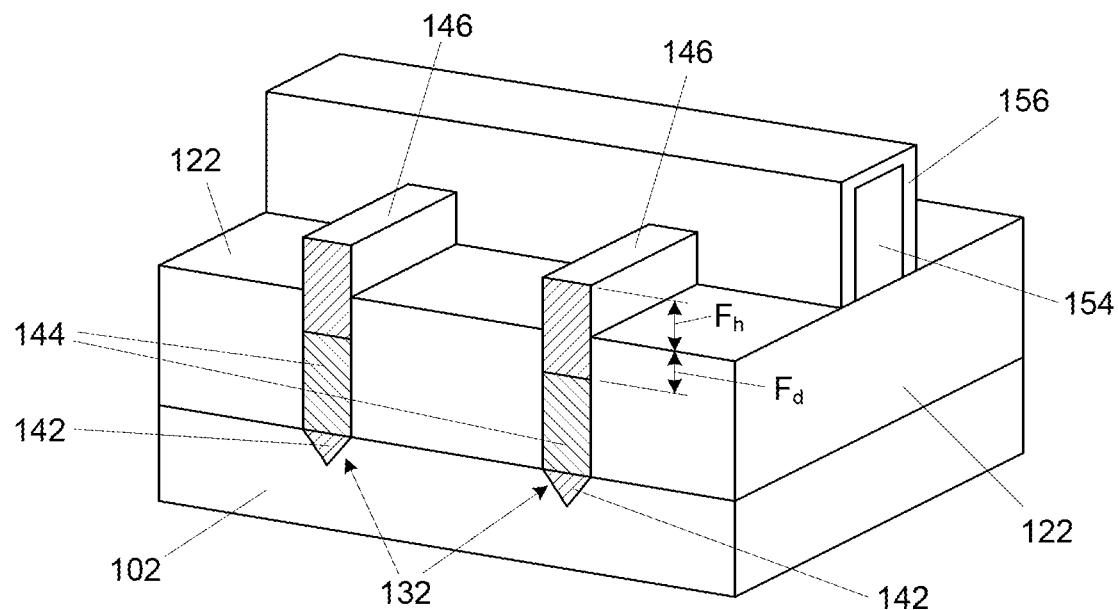

As shown in FIG. 8, a gate spacer 156 may be deposited and patterned on the gate electrode 154 with well-known deposition and etching techniques. The gate spacer 156 may be formed from any appropriate dielectric material, including, but not limited to, silicon oxide, silicon nitride, and the like.

It is understood that a source region and a drain region (not shown) may be formed in the active channel 146 on opposite sides of the gate 150 or a portions of the active channel 146 may be removed on opposite sides of the gate 150 and the source region and the drain region formed in place thereof. The source and drain regions may be formed of the same conductivity type, such as p-type conductivity. In some implementations of an embodiment of the present disclosure, the source and drain regions may have the substantially the same doping concentration and profile while in other implementations they may vary. It is understood that only n-MOS are shown, p-MOS regions would be patterned and processed separately.

Figure 9:
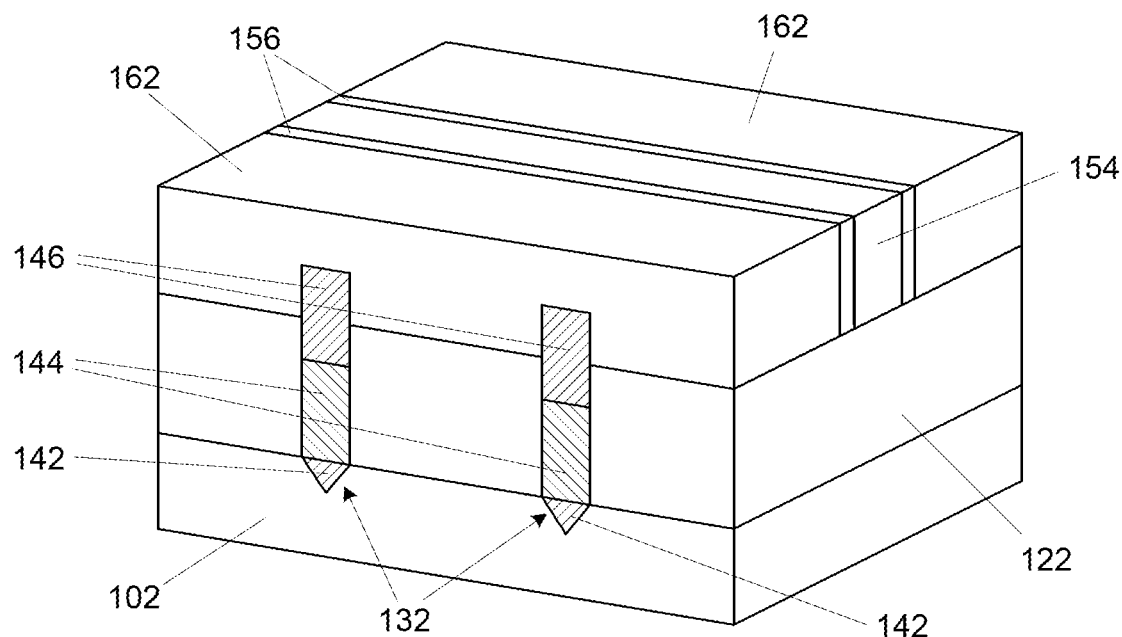
FIGS. 9-16 are oblique sectional and side cross-sectional views of forming an insulative buffer for a non-planar transistor, according to an embodiment of the present description.
Figure 10:
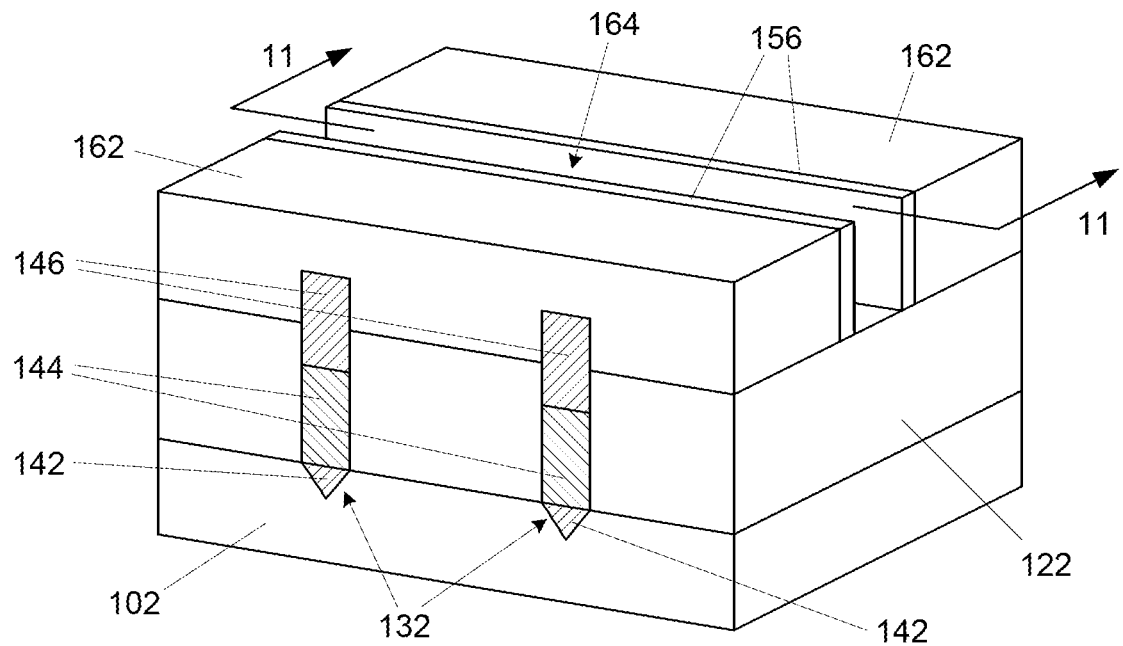
Figure 11:
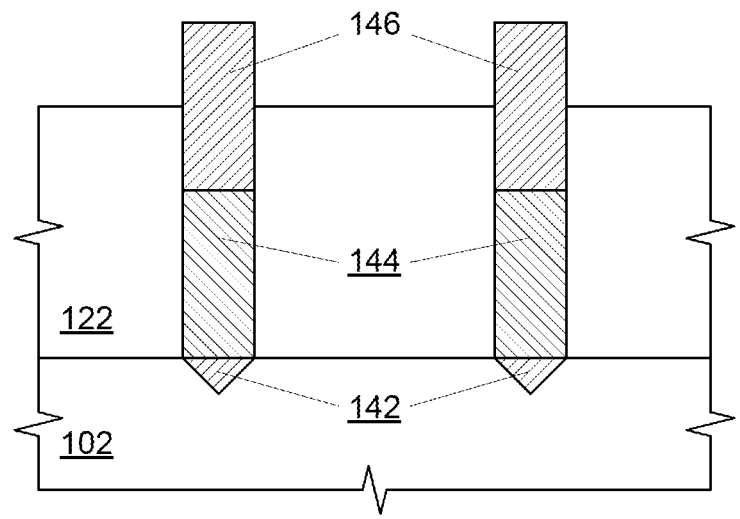

FIGS. 9-15 illustrate additional embodiments of the present description. Beginning with FIG. 7, a replacement gate process may be followed, wherein the gate dielectric 152 and the gate electrode 154 may be formed from sacrificial materials. A dielectric layer 162 may deposited over the structure of FIG. 8 and planarized to expose the sacrificial gate electrode 154, as shown in FIG. 9. The sacrificial gate electrode 154 and the gate dielectric 152 may be removed to expose the active channel 146 between the remaining portions of the gate spacer 156 forming a exposed active channel region 146, as shown in FIGS. 10 and 11 (cross-sectional view along line 11-11 of FIG. 10 with only cross-sectioned structures shown).

Figure 12:
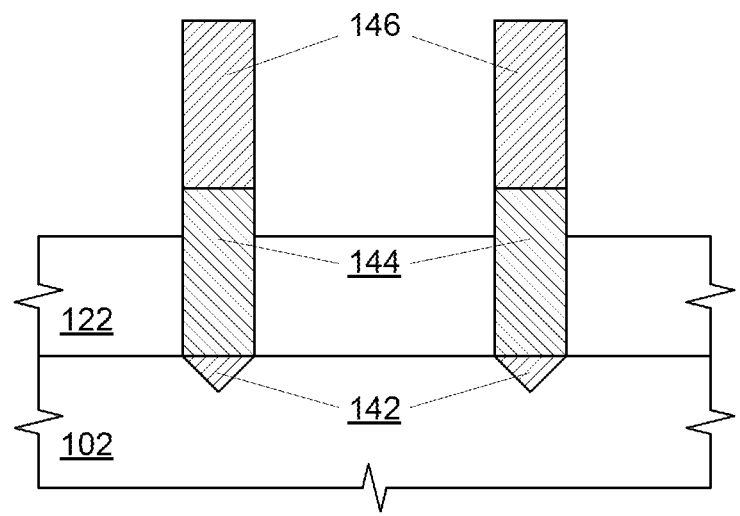
Figure 13:
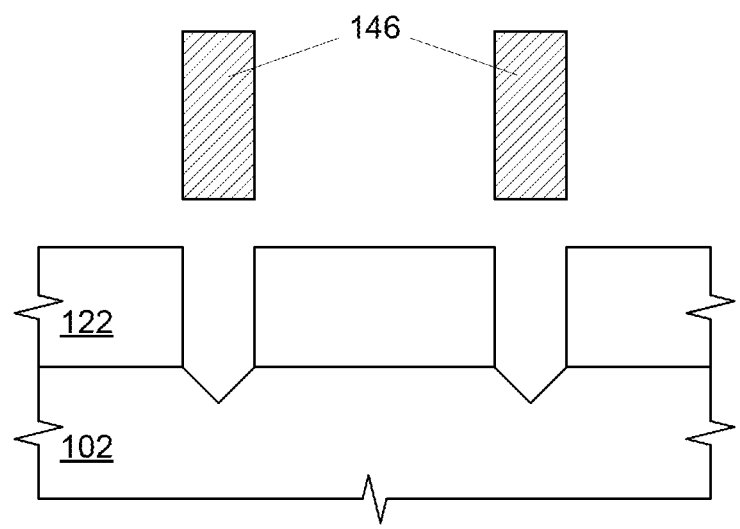

As shown in FIG. 12, the isolation structures 122 may be recessed within the exposed active channel region 146, such as by etching, to expose a portion of the sub-structure 144, such that a selective etch (e.g. wet etch, dry etch, or a combination thereof) may penetrate into the sub-structure 144 and remove the same including the nucleation layer 142, as shown in FIG. 13.

Figure 14:
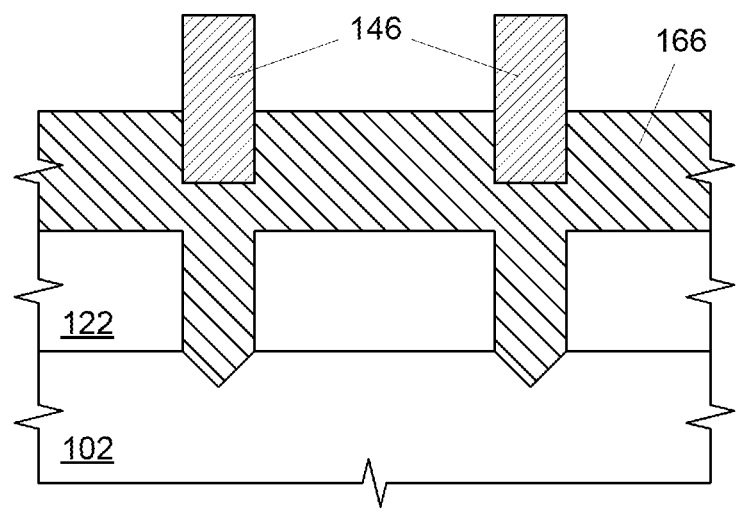
Figure 15:
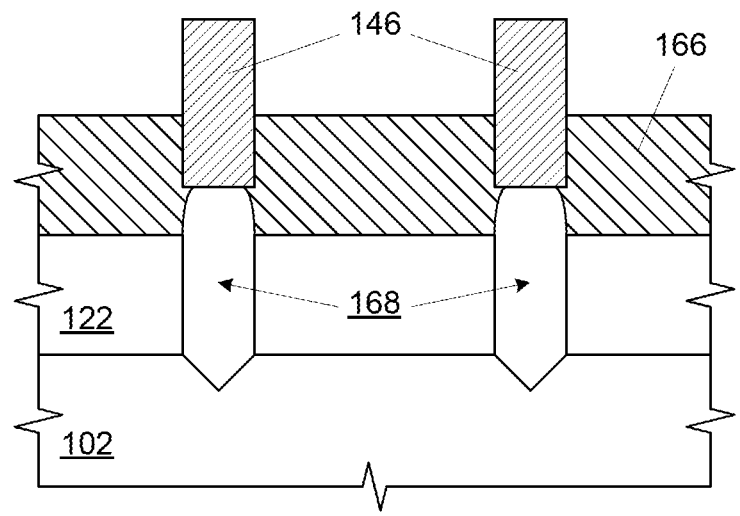
Figure 16:
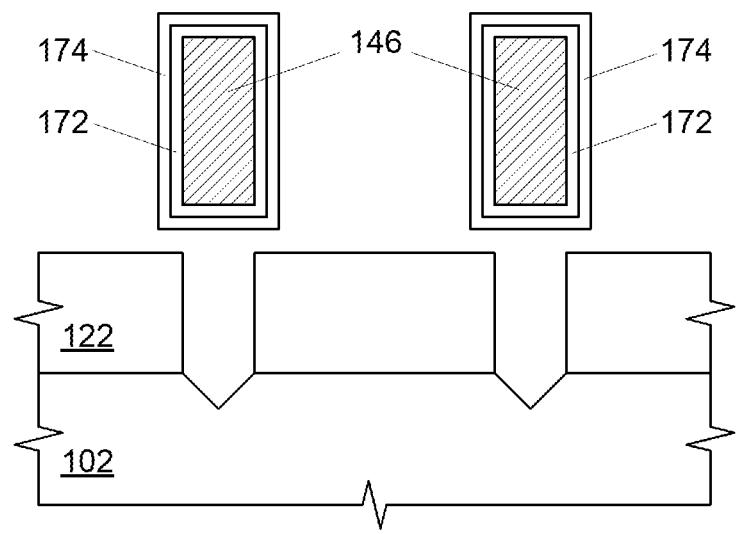

A dielectric material 166 may be deposited to fill the space left from the removal for the sub-structure 144 (see FIG. 12) and the nucleation layer 142 (see FIG. 12), as shown in FIG. 14, or to form a void 168, as shown in FIG. 15. Thereafter, the remaining components of a transistor may be formed following a known processing flow, such as a tri-gate processing flow, as will be understood to those skilled in the art. In another embodiment, as shown in FIG. 16, a gate oxide layer 172 may be formed to surround the exposed active channel 146 and a gate electrode layer 174 may be formed to surround the gate oxide layer 172 and the remaining components of a transistor may be following a known gate all-around processing flow in single or multiple wire configurations, as will also be understood to those skilled in the art.

It is noted that although the detailed description describes non-planar transistors, the present subject matter may be implemented in non-planar transistors, as will be understood to those skilled in the art.

Figure 17:
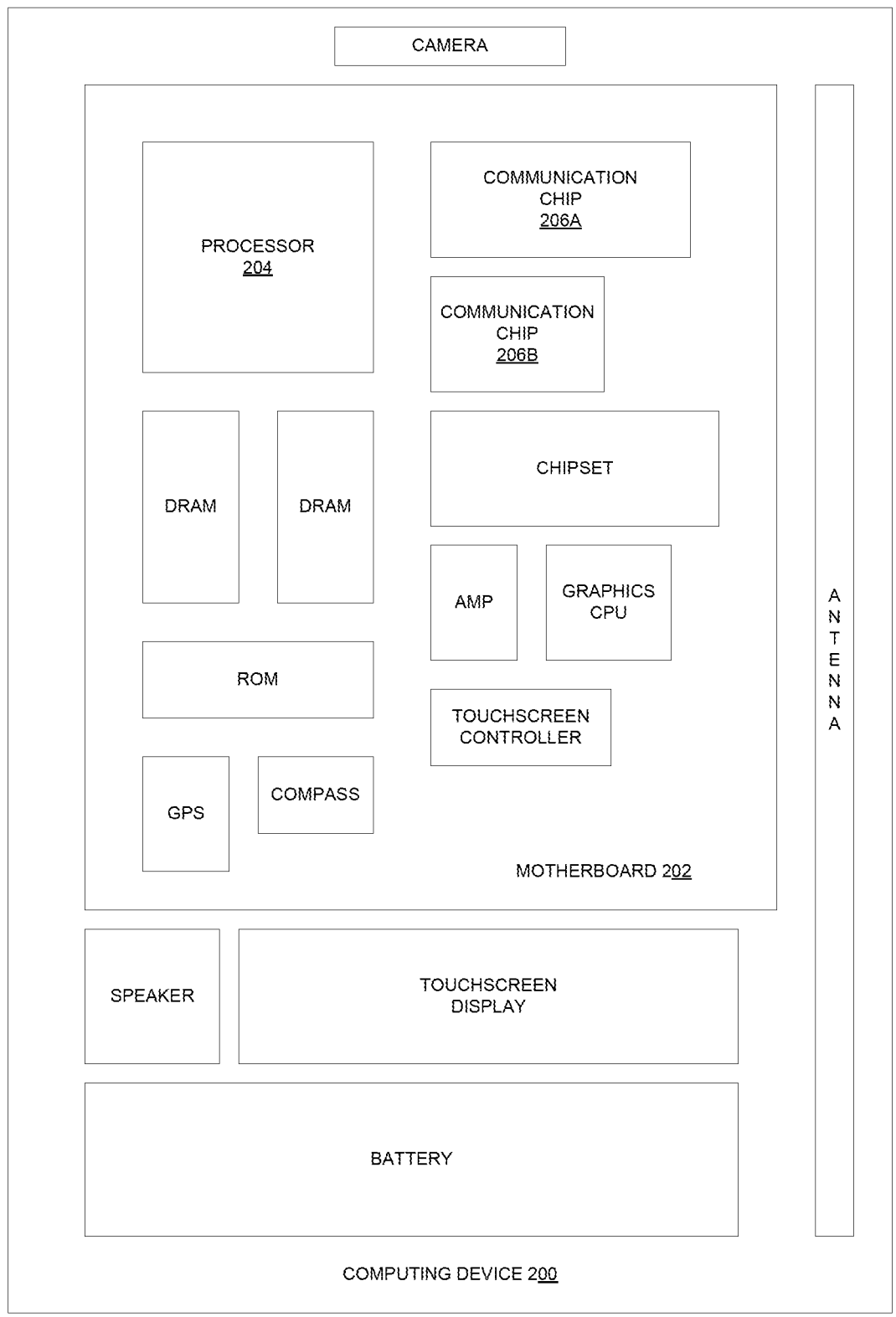
FIG. 17 illustrates a computing device in accordance with one implementation of the present description.

FIG. 17 illustrates a computing device 200 in accordance with one implementation of the present description. The computing device 200 houses a board 202. The board 202 may include a number of components, including but not limited to a processor 204 and at least one communication chip 206A, 206B. The processor 204 is physically and electrically coupled to the board 202. In some implementations the at least one communication chip 206A, 206B is also physically and electrically coupled to the board 202. In further implementations, the communication chip 206A, 206B is part of the processor 204.

Depending on its applications, the computing device 200 may include other components that may or may not be physically and electrically coupled to the board 202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 206A, 206B enables wireless communications for the transfer of data to and from the computing device 200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 200 may include a plurality of communication chips 206A, 206B. For instance, a first communication chip 206A may be dedicated to shorter range wireless communications such as Wi-Fi and Bluetooth and a second communication chip 206B may be dedicated to longer range wireless communications such as GPS, EDGE, GPRS, CDMA, WiMAX, LTE, Ev-DO, and others.

The processor 204 of the computing device 200 may include microelectronic transistors as described above. The term "processor" may refer to any device or portion of a device that processes electronic data from registers and/or memory to transform that electronic data into other electronic data that may be stored in registers and/or memory.

Furthermore, the communication chip 206A, 206B may include microelectronic transistors fabricated as described above.

In various implementations, the computing device 200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other electronic device that processes data.

It is understood that the subject matter of the present description is not necessarily limited to specific applications illustrated in FIGS. 1-17. The subject matter may be applied to other microelectronic device and assembly applications, as well as any other appropriate transistor applications, as will be understood to those skilled in the art.

The following examples pertain to further embodiments, wherein Example 1 is a microelectronic structure, comprising a substrate, a low band-gap active channel, and a high band-gap sub-structure disposed between the substrate and the low band-gap active channel, wherein the high band-gap sub-structure abuts the low band-gap active channel.

In Example 2, the subject matter of Example 1 can optionally include the high band-gap sub-structure comprising a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

In Example 3, the subject matter of any of Examples 1 and 2 can optionally include the low band-gap active channel comprising a material selected from the group consisting of indium gallium arsenide, indium arsenide, and indium antimonide.

In Example 4, the subject matter of any of Examples 1 to 3 can optionally include a nucleation trench extending into the substrate and a nucleation layer abutting the nucleation trench.

In Example 5, the subject matter of Example 4 can optionally include the nucleation trench comprises a nucleation trench having (111) faceting.

In Example 6, the subject matter of any of Examples 4 and 5 can optionally include the nucleation layer comprising a material selected from the group consisting of indium phosphide, gallium phosphide, and gallium arsenide.

In Example 7, the subject matter of any of Examples 1 to 6 can optionally include a portion of the active channel extending above the isolation structures and a gate formed over the portion of the active channel extending above the isolation structures.

In Example 8, the subject matter of any of Examples 1 to 7 can optionally include the high band-gap sub-structure having a depth greater than about 50 nm and a width of less than about 25 nm.

The following examples pertain to further embodiments, wherein Example 9 is a microelectronic structure, comprising a substrate including a nucleation trench therein, a low band-gap active channel over the nucleation trench, and an insulative buffer disposed between the nucleation trench and the low band-gap active channel.

In Example 10, the subject matter of Example 9 can optionally include the insulative buffer comprising an insulative material.

In Example 11, the subject matter of Example 9 can optionally include the insulative buffer comprising a void.

In Example 12, the subject matter of any of Examples 9 to 11 can optionally include the low band-gap active channel comprising a material selected from the group consisting of indium gallium arsenide, indium arsenide, and indium antimonide.

In Example 13, the subject matter of Example 12 can optionally include the nucleation trench comprising a nucleation trench having (111) faceting.

In Example 14, the subject matter of any of Examples 9 to 13, can optionally include a gate surrounding the active channel.

The following examples pertain to further embodiments, wherein Example 15 is a microelectronic structure, comprising forming at least one fin on a substrate, wherein the at least one fin comprises a pair of opposing sidewalls extending from the substrate; forming isolation structures abutting each of the fin sidewalls; forming a trench by removing the at least one fin; forming a high band-gap sub-structure in the trench; and forming a low band-gap active channel in the trench, which abuts the high band-gap substructure.

In Example 16, the subject matter of Example 15 can optionally include forming the high band-gap sub-structure comprises forming a high band-gap sub-structure having a depth greater than about 50 nm and a width of less than about 25 nm.

In Example 17, the subject matter of any of Examples 15 and 16 can optionally include forming the high band-gap sub-structure from a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

In Example 18, the subject matter of any of Examples 15 to 17 can optionally include forming the low band-gap active channel from a material selected from the group consisting of indium gallium arsenide, indium arsenide, and indium antimonide.

In Example 19, the subject matter of any of Examples 15 to 18 can optionally include forming a nucleation trench extending into the substrate.

In Example 20, the subject matter of Example 19 can optionally include forming the nucleation trench comprising forming a nucleation trench having (111) faceting.

In Example 21, the subject matter of any of Examples 15 and 19 can optionally include forming a nucleation layer abutting the nucleation trench.

In Example 22, the subject matter of Example 21 can optionally include forming the nucleation layer from a material selected from the group consisting of indium phosphide, gallium phosphide, and gallium arsenide.

In Example 23, the subject matter of any of Examples 15 to 22 can optionally include recessing the isolation structure, such that at least a portion of the active channel extends above the isolation structures.

In Example 24, the subject matter of any of Examples 15 to 23 can optionally include forming a gate over the portion of the active channel extending above the isolation structures.

In Example 25, the subject matter of any of Examples 15 to 24 can optionally include removing the high band-gap sub-structure to from a void between the low band-gap active channel and the substrate.

In Example 26, the subject matter of Example 25 can optionally include forming a gate to surround the low band-gap active channel.

In Example 27, the subject matter of any of Examples 25 and 26 can optionally include depositing an insulative material within the void.

Having thus described in detail embodiments of the present description, it is understood that the present description defined by the appended claims is not to be limited by particular details set forth in the above description, as many apparent variations thereof are possible without departing from the spirit or scope thereof.

The invention claimed is:

1. A microelectronic structure, comprising:
a substrate;
a low band-gap active channel;
a high band-gap sub-structure, comprising a single material, disposed between the substrate and the low band-gap active channel, wherein the high band-gap sub-structure is a single structure that is the single material that extends from the substrate and abuts the low band-gap active channel to form an intersection therebetween;
an isolation structure on the substrate, wherein the high band-gap sub-structure is embedded in the isolation structure and wherein a portion of the low band-gap active channel is embedded in the isolation structure and another portion of the low hand-gap active channel extends above the isolation structure, such that the intersection is below an upper plane of the isolation structure;
a nucleation trench extending into the substrate and a nucleation layer abutting the nucleation trench, wherein the high band-gap sub-structure and the nucleation layer are different materials and wherein the high band-gap sub-structure abuts the nucleation layer; and
a gate formed over the another portion of the active channel extending above the isolation structure, wherein the gate contacts the low band-gap active channel above the isolation structure.

2. The microelectronic structure of claim 1, wherein the high band-gap sub-structure comprises a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

3. The microelectronic structure of claim 1, wherein the low band-gap active channel comprises a material selected from the group consisting of indium gallium arsenide, indium arsenide, and indium antimonide.

4. The microelectronic structure of claim 1, wherein the nucleation trench comprises a nucleation trench having (111) faceting.

5. The microelectronic structure of claim 1, wherein the nucleation layer comprises a material selected from the group consisting of indium phosphide, gallium phosphide, and gallium arsenide.

6. The microelectronic structure of claim 1, wherein the high band-gap sub-structure has a depth greater than about 50nm and a width of less than about 25nm.

7. The microelectronic structure of claim 1, wherein isolation structure comprises a dielectric material.

8. The microelectronic structure of claim 7, wherein the dielectric material comprises silicon oxide.

9. The microelectronic structure of claim 1, wherein the gate comprises a gate electrode and a gate dielectric between the gate electrode and the active channel.

10. The microelectronic structure of claim 9, wherein the gate dielectric comprises a high-K dielectric material.

11. The microelectronic structure of claim 9, wherein the gate electrode comprises a metal.

12. The microelectronic structure of claim 9, further comprising a gate spacer formed on the gate electrode.

13. The microelectronic structure of claim 12, wherein the gate spacer comprises a dielectric material.

* * * * *